United States Patent [19]
Kumar

[11] Patent Number: 6,104,666
[45] Date of Patent: Aug. 15, 2000

[54] BIT LINE PRECHARGE APPARATUS AND METHOD

[75] Inventor: Manoj Kumar, Austin, Tex.

[73] Assignee: International Business Machines Corporation, Armonk, N.Y.

[21] Appl. No.: 09/329,458

[22] Filed: Jun. 10, 1999

Related U.S. Application Data

[62] Division of application No. 09/019,895, Feb. 6, 1998.

[51] Int. Cl.$^7$ ...................................................... G11C 8/00
[52] U.S. Cl. ..................................... 365/230.06; 365/203
[58] Field of Search ................................ 365/230.06, 203

[56] References Cited

U.S. PATENT DOCUMENTS 5,777,942   7/1998   Dosaka et al. ...................... 365/230.03

*Primary Examiner*—David Nelms
*Assistant Examiner*—M. Tran
*Attorney, Agent, or Firm*—Anthony V.S. England; Russell D. Culbertson

[57] ABSTRACT

A write driver apparatus (10) is adapted for producing a first data output signal and a second data output signal used in driving data onto a bit line pair (16, 18) associated with an electronic computer memory. The first and second data output signals represent desired data and are produced in response to a data signal, refill signal, and a data propagation clock signal. The data propagation signal is derived from system clock signals. A precharge circuit (12) associated with the write driver (10) operates in response to a precharge clock signal to precharge the bit lines (16, 18) prior to each read or write operation. The precharge clock signal is related to the data propagation signal to ensure that the bit lines (16, 18) are fully precharged prior to a read operation. A keeper circuit (14) associated with the bit lines (16, 18) also helps maintain a desired charge state on the bit lines during a read operation from memory cells (20) connected to the bit lines.

11 Claims, 2 Drawing Sheets

BIT LINE PRECHARGE APPARATUS AND METHOD

CROSS REFERENCE TO RELATED APPLICATION

This application is a divisional application of Ser. No. 09/019,895, filed Feb. 6, 1998, entitled "Write Driver and Bit Line Precharge Apparatus and Method."

TECHNICAL FIELD

This invention relates to electronic computer memory and particularly to cache memory. The invention includes a write driver and precharge circuit, as well as a method for precharging a bit line pair and writing to an electronic computer memory.

BACKGROUND OF THE INVENTION

The memory available to a microprocessor commonly includes special high speed memory referred to as cache memory or simply cache. Cache memory comprises an array of individual memory cells, each memory cell adapted to store one bit of data. A number of memory cells are arranged in a column connected by two conductors referred to as a bit line pair. The memory includes a number of such columns of memory cells. Data is written to or transferred from the memory cells via the bit line pair associated with each column of memory cells. A voltage signal in a "high" range on one bit line of the bit line pair represents one logical state while a voltage signal in a "high" range on the opposite bit line represents the opposite logical state. The memory cells are connected in rows by word lines which are used to activate a particular memory cell in a column and allow data, that is, one logical state or the other, to be written to or transferred from the particular cell.

A write driver is used to control the charge state of the bit line pairs during a writing operation to a memory cell within a column. The write driver comprises a circuit connected to the bit line pair which causes the bit lines in the pair to have the desired voltage state representing the data to be stored in a memory cell. A column decoder and sense amplifier are also connected to the bit line pair for reading data which has been stored in the memory cells. A bit line precharge circuit commonly accompanies the write driver circuit. The bit line precharge circuit operates to charge both lines of the bit line pair prior to a read or write operation.

The operation of the write driver and precharge circuit are crucial to the operation of the cache and thus the microprocesor. If the write driver does not operate properly, wrong data or instructions will be stored or written into cache. The precharge circuit must also operate properly to ensure that the intended data is read during a read operation from cache. Without the proper precharge, an incorrect charge state may occur on the bit line pair during a read operation, resulting in incorrect data or instructions being read from memory.

Another problem arises during a read operation from the memory cells along the bit line pair. In a read operation, the logical high charge must be maintained on one of the bit lines of the pair. In the prior art, the charge is maintained only by a small transistor in the selected memory cell. However, the capacitance associated with the bit line and junction capacitance associated with the transfer gate device of the memory cells can cause the charge on the bit line to decay to an unacceptable level during a long read operation.

SUMMARY OF THE INVENTION

It is an object of the invention to provide a precharge apparatus and method which helps facilitate correct read and write operations in an electronic compiler memory, including cache memory.

To accomplish these objects, the precharge arrangement according to the invention synchronizes the precharge and write operations with common system clock signals. The synchronization between the precharge and writing operations ensures that the bit lines are properly precharged after data is written and also prevents interference with the desired data. A keeper circuit is associated with the bit line pair to ensure that the desired bit line maintains its high charge state throughout a long read operation.

The write driver includes a write driver logic circuit having two data output lines, one corresponding to a first or true bit line and the other corresponding to a second or complement bit line of the bit line pair. The write driver logic circuit is adapted to receive a data input signal from main memory through a data input, and to receive a write enable signal or refill signal from the processor through a refill input. According to the invention, the write driver logic circuit also receives a data propagation clock signal. The data propagation clock signal is derived from the system clocks and times when data is written to, or transferred from, the bit line pair and selected memory cell. The write driver also includes a tri-state buffer through which the desired charge is applied to the bit line pair in response to the state of the data output lines associated with the write driver logic circuit.

Controlling the write driver by a clock signal derived from the system clock signals provides flexibility in debugging in the write mode. Since the writing operation is controlled by the system clocks, slowing the system clock delays the writing operation to make sure the desired word line is on and the correct data is written to the memory cell. However, a hard failure is indicated when a write error occurs both at a regular clock speed and at a slower speed.

The precharge circuit includes two precharge transistors each connected to a different bit line for applying a supply voltage to the respective bit line. Also, the precharge circuit preferably includes an equalizing transistor connected between each bit line to equalize the charge between the bit lines. According to the invention, each transistor in the precharge circuit is controlled by a precharge clock signal derived from the system clock signals and related to the data propagation clock signals which control when data is forced from the write driver or read from a selected memory cell. In each system clock cycle, the precharge clock signal precedes the data propagation signal. This synchronization between the precharge circuit and write driver eliminates the problem arising when one or both of the bit lines are not fully charged to the desired voltage at the start of a read operation. Also, the synchronization between the write driver and the precharge circuit ensures that the precharge does not interfere or fight with a desired charge state forced from the write driver.

The keeper circuit comprises two keeper transistors. One keeper transistor is connected to control current from the supply voltage source to one bit line and the other keeper transistor is connected to control current from the supply voltage source to the other bit line of the bit line pair. Current through each keeper transistor is controlled by the charge state of the opposite bit line. A low charge state on one bit line causes the keeper transistor associated with the opposite bit line to conduct and maintain the charge level of the opposite bit line. This keeper arrangement thus ensures that the desired bit line is maintained at the desired high charge level throughout a long read operation despite the capacitance associated with the bit line and the memory cells.

These and other objects, advantages, and features of the invention will be apparent from the following description of the preferred embodiments, considered along with the accompanying drawings.

DESCRIPTION OF THE PREFERRED EMBODIMENTS

Figure 1:
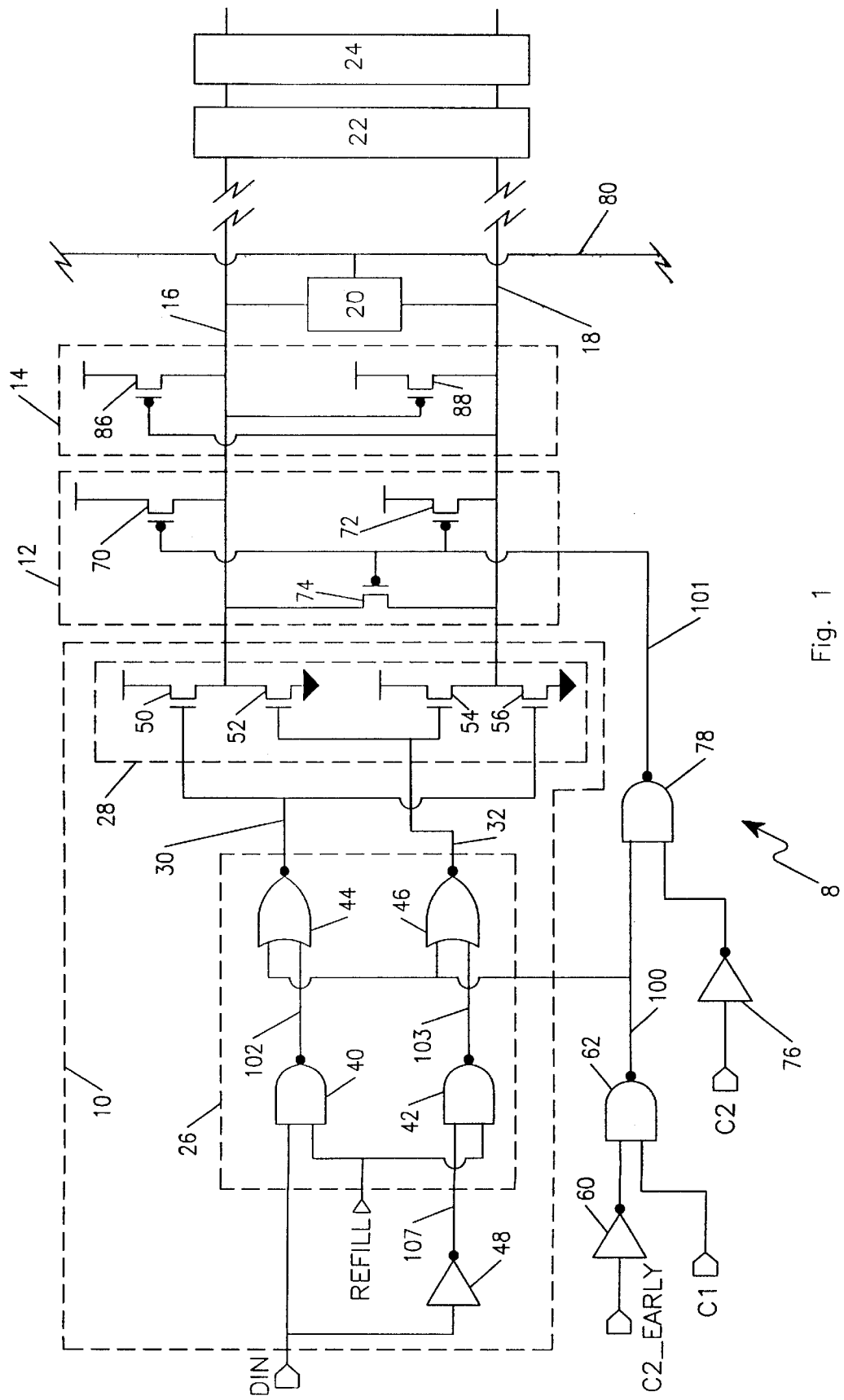
FIG. 1 is an electrical schematic diagram showing a write driver and precharge circuit embodying the principles of the invention.

Referring to FIG. 1, a circuit 8 embodying the principles of the invention includes a write driver circuit 10, a precharge circuit 12, and a keeper circuit 14. Each of the circuits receives clock signals derived from system clock signals C1, C2_Early, and C2. Also, each of the circuits included in the invention is associated with a bit line pair comprising a first bit line 16 and a complement or second bit line 18. The bit line pair is connected to a plurality of individual memory cells 20. Although not forming part of the invention, the bit line pair is also associated with a column decoder 22 and a sense amplifier 24 which operate to read data from the memory cells 20.

The write driver circuit 10 includes a write driver logic circuit 26 and a tri-state buffer arrangement 28. The write driver logic circuit 26 includes two output lines, a first output 30 corresponding to the first bit line 16 and a second output 32 corresponding to the second bit line 18. The write driver logic circuit 26 receives data from a data input DIN, a write enable or refill input REFILL, and a data propagation clock signal at node 100, and operates to provide the desired logic state at the two outputs 30 and 32. The tri-state buffer arrangement 28 is controlled by the two output lines 30 and 32 to apply the desired charge state to the bit lines 16 and 18.

The data input DIN receives data from a cache reload buffer (not shown). The refill input REFILL dictates a write mode in one logic state and a read mode in the opposite logic state.

The write driver logic circuit 26 includes two NAND gates 40 and 42 and two NOR gates 44 and 46. The data input signal on DIN is applied as one input to NAND gate 40 and is also inverted at inverter 48 and the resulting inverted signal applied as an input to the other NAND gate 42. The refill signal at REFILL is applied to the other input of both NAND gates 40 and 42. The NAND gates 40 and 42 and inverter 48 comprise an intermediate logic arrangement which provides a certain logic state at the intermediate outputs, nodes 102 and 103, depending upon the data at DIN and refill signal.

The output of NAND gate 40 forms an input for NOR gate 44, whereas the output of the other NAND gate 42 forms an input for the other NOR gate 46. The data propagation clock signal at node 100 provides the other input of both NOR gates 44 and 46.

The preferred tri-state buffer arrangement 28 comprises two charging transistors and two drawdown transistors, all NMOS devices in the illustrated form of the invention. A first charging transistor 50 has its drain-source current path connecting the supply voltage $V_{dd}$ and the first bit line 16. A first drawdown transistor 52 has its drain-source current path connecting the first bit line 16 and ground. A second charging transistor 54 has its drain-source current path connecting the supply voltage $V_{dd}$ and the second bit line 18. Finally, a second drawdown transistor 56 has its drain-source current path connecting the second bit line 18 and ground. The gates of the first charging transistor 50 and second drawdown transistor 56 are both connected to the first output 30 of the write logic circuit 26, while the gates of the second charging transistor 54 and first drawdown transistor 52 are connected to the second output 32 from the write driver logic circuit.

The data propagation clock signal is derived from system clock signals C1, or the first clock signal, and a second clock signal C2_Early. The C2_Early clock signal is inverted at inverter 60 and the resulting inverted signal applied as one input of NAND gate 62. Clock input Cl is applied as the other input of NAND gate 62. The output of the NAND gate 62 at node 100 remains at a logical high state except when the first clock signal Cl is high and the second clock signal C2_Early is low. The Cl high and C2_Early low condition produces a low signal at node 100 and this low signal comprises the data propagation clock signal which times when data is forced onto the bit line pair 16 and 18 by write driver 10 or is read from a selected memory cell.

As used in this disclosure the word "high" will be used to describe a logical high voltage state. The word "low" will be used to describe a logical low voltage state. The particular voltage ranges which may comprise a "high" state and a "low" state may vary from application to application and do not form a part of the invention.

In operation, the cache reload buffer (not shown) drives the data input, applying the desired logical state at DIN. Depending upon the data, either node 107 or DIN will be high and the other low. A high refill signal at REFILL facilitates a write mode of operation and forces one intermediate output, either node 102 or 103, low and the other of these two nodes high. A data propagation clock signal, that is, a low signal at node 100 in the presence of a high refill signal at REFILL, produces a desired logical state at the data outputs 30 and 32. The desired logical state at outputs 30 and 32 drives the tri-state buffer 28 to force the desired charge state on the bit lines 16 and 18. A high signal at output 30 turns "on" the first charging transistor 50 and the second drawdown transistor 56. At the same time the second output 32 remains low and the thus, the second charging transistor 54 and first drawdown transistor 52 remain "off". In this state, the supply voltage $V_{dd}$ is applied to the first bit line 16 and the second bit line 18 is pulled down to ground. In the opposite logical condition in which the second output 32 is high and the first output 30 is low, the supply voltage $V_{dd}$ is applied through the second charging transistor 54 to the second bit line 18 whereas the first bit line 16 is pulled down to ground through the first drawdown transistor 52. In each case, the same logical output signal (either a high signal at output 30 or 32) operates both to apply the supply voltage $V_{dd}$ to a desired bit line, and pull the opposite bit line down to ground.

The method of writing data to the bit lines 16 and 18 according to the invention includes producing a first data output signal either high or low at the first output 30 and producing a complement second data output signal either high or low at the second output 32. The method also includes forcing a desired charge state on the first bit line 16 and a complement charge state on the second bit line 18 in response to the data output signals at the first and second outputs 30 and 32. A high signal at output 30 and low signal at output 32 results in one charge state on bit lines 16 and 18 while the opposite conditions at the outputs 30 and 32 result in the opposite charge state on the bit lines. According to the invention, the data output signals at outputs 30 and 32 are produced only in response to the data input DIN, the refill input REFILL, and the data propagation clock signal which comprises a low state at node 100. Thus, data may be written to the bit lines 16 and 18 only in the presence of the data propagation clock signal derived from system clocks C1 and C2_Early.

The precharge circuit 12 includes a first precharge transistor 70, a second precharge transistor 72, and a charge equalizing transistor 74, each a PMOS device in the illustrated form of the invention. The first precharge transistor 70 has its source-drain current path connecting the supply voltage $V_{dd}$ and the first bit line 16 whereas the second precharge transistor 72 has its source-drain current path connecting the supply voltage $V_{dd}$ to the second bit line 18. The equalization transistor 74 has its source-drain current path connecting the first and second bit lines 16 and 18, respectively. The gate of each transistor 70, 72, and 74 is connected to a precharge input at node 101 to receive a precharge clock signal.

The precharge clock signal applied at node 101 is derived from the data propagation clock signal at node 100 and a third clock signal C2 through a precharge clock signal arrangement including inverter 76 and NAND gate 78. Clock signal C2 is inverted at inverter 76 and the inverted signal applied as an input to NAND gate 78. The data propagation clock signal is applied as the second input to NAND gate 78. In operation, a low output at node 101 represents a precharge clock signal which turns "on" the three PMOS devices 70, 72, and 74. When the three PMOS devices 70, 72, and 74 are "on", both bit lines 16 and 18 are equalized to the same precharge level, supply voltage $V_{dd}$. When node 101 is high, no precharge signal is supplied to the three precharge devices 70, 72, and 74 and all three devices are "off" and have no effect on the charge state of the bit lines 16 and 18.

Figure 2:
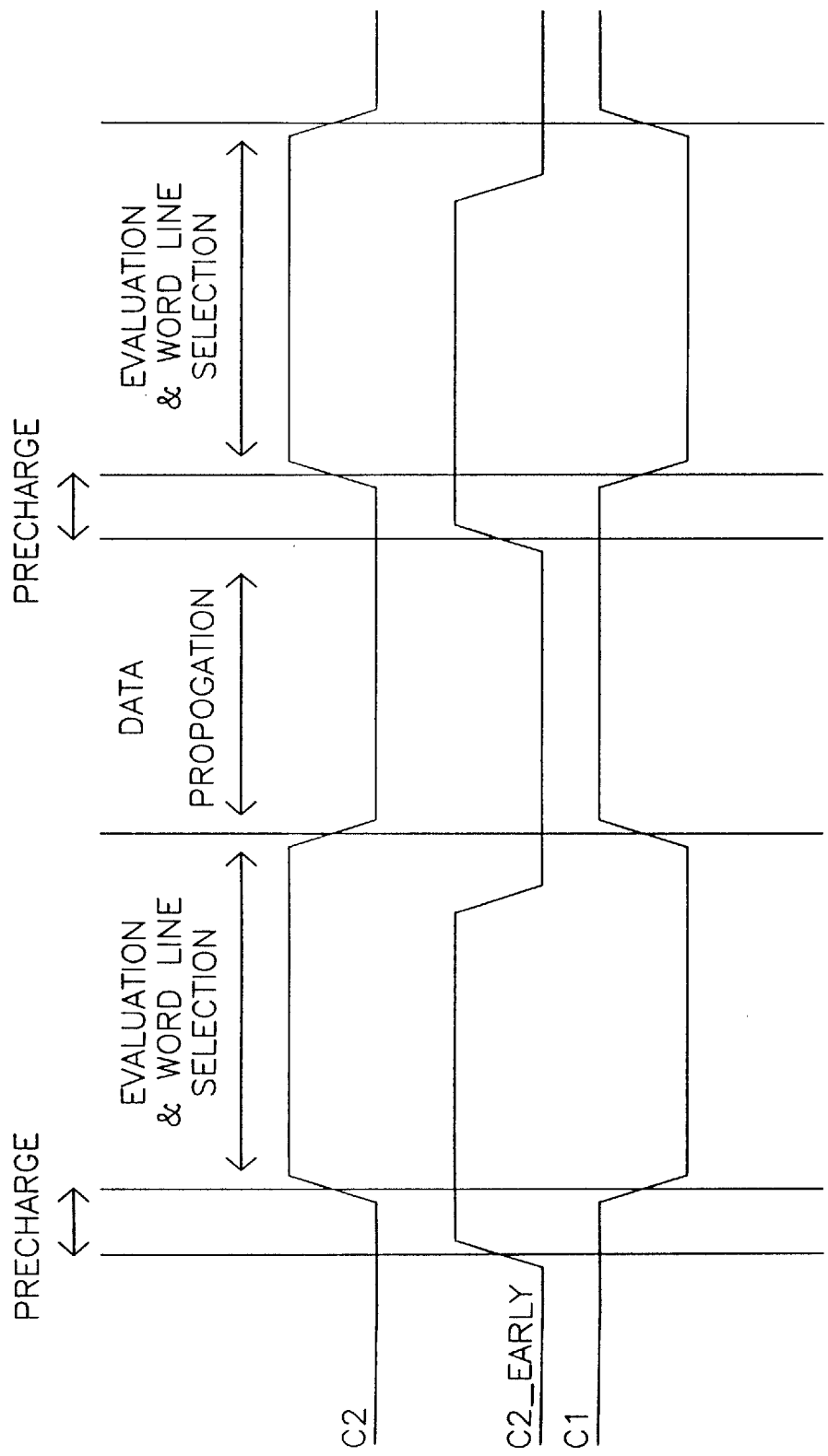
FIG. 2 is a timing chart showing the system clock signals employed by the circuit shown in FIG. 1.

The synchronization between the write driver circuit 10 and precharge circuit 12 and the method of precharging the bit lines 16 and 18 may now be described with reference to FIG. 1 and to the timing chart shown in FIG. 2. The first clock input C1 is opposite in phase to the third clock input C2, whereas the second clock input C2 Early is well out of phase with signal C1, going high slightly earlier than clock signal C2. For example, C2_Early may go high on the order of 500 picoseconds before C2. When clock signal C1 goes high, signal C2_Early is low and this condition produces a data propagation clock signal at node 100. The circuit 8 goes into a data propagation mode in response to the data propagation clock signal. In the data propagation mode, data is written to or read from a selected memory cell 20 depending upon the state of the refill input REFILL. When the REFILL input signal is high, the circuit 8 is in a write mode, whereas when the REFILL input signal is low the circuit 8 is in a read mode. When the circuit 8 is in the write mode, the high going C1 signal causes either output 30 or output 32 to go high maintaining one of the bit lines 16 or 18 at $V_{dd}$ and pulling the other bit line to ground. However, when the second clock signal C2_Early goes high at the end of the C1 clock signal, the circuit 8 goes into a precharge mode. In the precharge mode the transistors 50, 52, 54, and 56 of the tri-state buffer 28 are all turned "off", and node 101, the precharge input, is forced low representing a precharge clock signal. In response to this precharge clock signal, that is, low state at node 101, the precharge PMOS devices 70, 72, and 74 are all turned "on" and both bit lines 16 and 18 are precharged to the supply voltage $V_{dd}$.

When the third clock signal C2 goes high, the precharge clock signal is removed and node 101 is forced high to turn "off" each of the precharge devices 70, 72, and 74. The write driver transistors 50, 52, 54, and 56 are also necessarily "off" since C1 is now low. At this point, the circuit 8 is in an evaluation mode in which a word line 80 may be selected to select a particular memory cell 20 in the column. The high going edge of clock signal C1 produces a data propagation clock signal placing the circuit 8 once again in the data propagation mode, either a read mode or a write mode depending upon the state of the refill signal REFILL.

The keeper circuit shown at 14 in FIG. 1 comes into play when data is read from the memory cells 20. The keeper circuit 14 includes a first keeper transistor 86 and a second keeper transistor 88, both PMOS devices in the illustrated form of the invention. The first keeper transistor 86 has its source-drain current path connecting the supply voltage $V_{dd}$ to the first bit line 16 whereas the second keeper transistor 88 has its source-drain current path connecting the supply voltage $V_{dd}$ to the second bit line 18. The gate of keeper transistor 86 is connected to the second bit line 18, and the gate of keeper transistor 88 is connected to the first bit line 16.

In the read operation, one of the bit lines must be maintained in a high state through a small transistor (not shown) in one of the memory cells 20. It is difficult for the small memory cell transistor to sustain the high bit line level in a long read operation considering the junction capacitance of the transfer gates in the memory cells and the capacitance of the bit line itself. However, with the keeper circuit 14, the low side bit line turns on the keeper transistor associated with the opposite bit line and maintains that opposite bit line at the supply voltage level in the long cycle to compensate for the bit line leakage.

For example, a logic state read from one of the memory cells 20 may require that first bit line 16 be held high while the second bit line 18 is allowed to go low. In this case, as bit line 18 drifts low, the voltage signal at the gate of first keeper transistor 86 goes low and turns the transistor "on", that is, becomes conductive along the drain-source current path. When transistor 86 goes "on", the supply voltage $V_{dd}$ is applied to the first bit line 16 to ensure that the bit line remains at the desired high logical charge state throughout the read operation.

The keeper circuit 14 also assists in producing the desired charge state on the bit lines 16 and 18 in the event that data is late at the data input DIN. When data is late at DIN and the clock signal C1 goes high, an incorrect charge state may be produced on the bit lines 16 and 18. This incorrect charge state must be corrected when the desired data arrives at DIN. When the desired data does arrive at DIN during the data propagation clock signal, the desired outputs at 30 and 32 cause the tri-state buffer to change the charge state on the bit lines 16 and 18 to the charge state representing the desired data. The low going signal on one bit line to reach the desired charge state turns on the keeper transistor associated with the opposite bit line, which pulls the opposite bit line all the way to $V_{dd}$.

The above described preferred embodiments are intended to illustrate the principles of the invention, but not to limit the scope of the invention. Various other embodiments and modifications to these preferred embodiments may be made by those skilled in the art without departing from the scope of the following claims. For example, although the illustrated tri-state buffer arrangement is preferred, other buffer arrangements may be employed within the scope of the invention. Also, other logic arrangements may be employed in the write driver logic circuit and to produce the desired clock signals from the system clocks.

I claim:

1. An apparatus for precharging a bit line associated with an electronic computer memory, the apparatus comprising:
   (a) a write driver circuit for producing a desired charge state on a first bit line in response to a data input signal, a refill signal, and a data propagation clock signal, the charge state on the first bit line representing desired data;
   (b) precharge clock signal means for producing a precharge clock signal, the precharge clock signal being related to the data propagation clock signal; and
   (c) a precharge circuit for applying a precharge to the first bit line in response to each precharge clock signal.

2. The apparatus of claim 1 wherein the precharge circuit includes:
   (a) a first precharge transistor having its source-drain current path connecting the first bit line to a supply voltage source and having its gate connected to receive the precharge clock signal.

3. The apparatus of claim 1 wherein:
   (a) the write driver circuit is also for producing a complement charge state on a second bit line concurrently with producing the desired charge state on the first bit line; and
   (b) the precharge circuit is also for applying the precharge to the second bit line in response to each precharge clock signal.

4. The apparatus of claim 3 wherein the precharge circuit includes:
   (a) a first precharge transistor having its source-drain current path connecting the first bit line to a supply voltage source and having its gate connected to receive the precharge clock signal; and
   (b) a second precharge transistor having its source-drain current path connecting the second bit line to the supply voltage source, and having its gate connected to receive the precharge clock signal.

5. The apparatus of claim 4 further comprising:
   (a) an equalizing transistor having its source-drain current path connecting the first bit line and the second bit line, and having its gate connected to receive the precharge clock signal.

6. The apparatus of claim 1 further wherein:
   (a) the data propagation clock signal is derived from a first clock signal and a second clock signal, the second clock signal being out of phase with the first clock signal by a data propagation period; and
   (b) the precharge clock signal is derived from the data propagation clock signal and a third clock signal which has opposite phase to the first lock signal.

7. A method for precharging a bit line associated with an electronic computer memory, the method comprising the steps of:
   (a) producing a data propagation clock signal and a precharge clock signal every cycle of a system clock cycle, the precharge clock signal being timed to precede the data propagation clock signal in each system clock cycle;
   (b) applying a precharge to a first bit line in response to the precharge clock signal in each system clock cycle; and
   (c) producing a desired charge state on the first bit line in response to the data propagation signal, a data input signal, and a refill signal.

8. The method of claim 7 wherein the step of applying the precharge to the first bit line comprises:
   (a) applying the precharge clock signal to switch on a transistor having its source-drain current path connecting the first bit line to a supply voltage source.

9. The method of claim 8 further comprising:
   (a) applying the precharge to a second bit line in response to the precharge clock signal in each system clock cycle; and
   (b) producing a complement charge state on the second bit line in response to the data propagation signal, the data input signal, and the refill signal.

10. The method of claim 9 wherein the step of applying the precharge to the second bit line comprises:
    (a) applying the precharge clock signal to switch on a transistor having its source-drain current path connecting the second bit line to the supply voltage source.

11. The method of claim 7 further comprising the steps of:
    (a) deriving the data propagation clock signal from a first clock signal and a second clock signal, the second clock signal being out of phase with the first clock signal by a data propagation period; and
    (b) deriving the precharge clock signal from the data propagation clock signal and a third clock signal which has opposite phase to the first clock signal.

* * * * *